United States Patent [19]

Kwok

[11] Patent Number: 4,985,369
[45] Date of Patent: Jan. 15, 1991

[54] METHOD FOR MAKING SELF-ALIGNED OHMIC CONTACTS

[75] Inventor: Siang P. Kwok, Colorado Springs, Colo.

[73] Assignee: Ford Microelectronics, Inc., Colorado Springs, Colo.

[21] Appl. No.: 241,814

[22] Filed: Sep. 2, 1988

Related U.S. Application Data

[63] Continuation of Ser. No. 5,753, Jan. 21, 1987, abandoned.

[51] Int. Cl.$^5$ .......................................... H01L 21/265
[52] U.S. Cl. ...................................... 437/41; 437/80; 437/175; 437/178; 437/179; 437/187; 437/912; 437/984
[58] Field of Search ............... 437/229, 228, 944, 187, 437/188, 245, 203, 80, 912, 41

[56] References Cited

U.S. PATENT DOCUMENTS

| | | | |
|---|---|---|---|
| 3,761,785 | 9/1973 | Pruniaux | 437/80 |
| 3,943,622 | 3/1976 | Kim et al. | 437/80 |
| 3,951,708 | 4/1976 | Dean | 437/80 |
| 4,048,712 | 9/1977 | Buiatti | |
| 4,525,919 | 7/1985 | Fabian | 437/80 |
| 4,534,826 | 8/1985 | Gath | 437/67 |

FOREIGN PATENT DOCUMENTS 54-8972  1/1979  Japan ................................. 437/80

Primary Examiner—Brian E. Hearn
Assistant Examiner—Chandra Chaudhari
Attorney, Agent, or Firm—Brooks & Kushman

[57] ABSTRACT

A method of making a semiconductor device with self-aligned ohmic contacts which exhibits substantially reduced shadowing. The gate material is covered with a layer of gate mask material. The gate mask material is selectively removed to form a gate mask having sidewalls with slope profiles of an inclination sufficient to avoid maximum shadow encroachment for subsequent material depositions. Gate mask material is characterized by the sidewalls having an angularity relative to the surface of the substrate which is at least as great as the angle of evaporative deposition of ohmic contact material from a point evaporative source to the extreme gate position on the substrate.

14 Claims, 3 Drawing Sheets

METHOD FOR MAKING SELF-ALIGNED OHMIC CONTACTS

This is a continuation of application Ser. No. 005,753 filed on Jun. 21, 1987, now abandoned.

TECHINCAL FIELD

The subject invention pertains to a method for fabricating gallium arsenide semiconductors including controlled deposition of ohmic contact materials for self-aligning with reduced shadowing.

BACKGROUND OF THE INVENTION

Semiconductor production involves many intricate steps and precise handling is required in each step. Wafer substrates may undergo ion implantations, various depositions, etching processes, evaporations, annealing procedures, and other procedures to achieve a complete semiconductor device. Each of the steps include a myriad of parameters to be considered for the best possible production of devices.

Heretofore, gallium arsenide semiconductors have been produced by an assortment of methods. Doped gallium arsenide epitaxial layers have been grown on semi-insulating gallium arsenide substrates, as described in U.S. Pat. No. 3,770,518 issued Nov. 6, 1973 to Rosztoczy et al. Bell Telephone Laboratories has done an extensive amount of research on gallium arsenide structures grown by molecular beam epitaxy as described in U.S. Pat. No. 4,205,329 issued May 27, 1980 to Dingle et al.

The currently used technology of vapor deposition to construct gallium arsenide devices aids in the construction of device components requiring very small dimensions. A gallium arsenide self-aligning gate field effect transistor (SAGFET) can be produced with components having dimensions small enough to exhibit low power and other advantageous attributes. However, the number of limitations resulting from those same small dimensions make device manufacturing very difficult. Reproducibility is effected by details which are now under consideration.

An example of one of those difficulties involves the self-aligned fabrication process required to produce a gallium arsenide semiconductor. The objective is to control the position of the ohmic contact material evaporated for self-alignment while minimizing the shadowing effect of the gate mask. If the gate mask is quite thick, shadowing occurs and causes a difference in the distances between the gate and the first ohmic contact material on one side and the gate and the second ohmic contact material on the other side. The substrate dimensions determine whether or not production tolerances can be met.

The reliability of gallium arsenide devices, especially field effect transistors, is directly related to the integrity of the ohmic contacts on the semiconductor surface. Presently, production methods require high tolerances for shadowing. This presents a reproducibility problem during production due to the non-symmetrical deposition of ohmic contact material. If evaporation is used as the method of depositing the ohmic contact material, the evaporation source is essentially a point, while the wafer substrate is a planar surface. The distance between the evaporation source and the center point of the wafer determines the radius R of the circle. Typically, the deposition equipment used in this procedure is a half dome shape having wafer substrates requiring deposition placed as efficiently as possible against the interior surface. The evaporation path is perpendicular to the wafer substrate at its center point. However, the evaporation path from the source to masked areas at the outerlying edges of the wafer substrate strikes the substrate at an angle. That angle is defined by: (1) the perpendicular path between the evaporation source and the center point of the wafer substrate, (2) the planar surface of the wafer substrate itself, and (3) the hypotenuse of the angular evaporation path between the evaporation source and an off-center masked region on the wafer substrate. Currently, the masks used in self-alignment processes cause non-symmetrical deposition of ohmic contact materials because of this angle of evaporation.

As the wafer substrates get larger, the problem is accentuated for outerlying masked regions because the angle of evaporation increases due to the greater distance from the center of the wafer substrate. For commercial reasons, production techniques must be compatible with the use of larger and larger wafer substrate sizes, while maintaining a sufficiently low tolerance to yield good quality semiconductor devices.

U.S. Pat. No. 4,379,005 issued on Apr. 5, 1983 to Hovel et al discloses an invention which involves the fabrication of semiconductor devices by providing as an intermediate manufacturing structure a substrate of one semiconductor material on which there is a thin epitaxial layer of another semiconductor material. Both materials have a different solubility in a particular metal. A process of fabrication is described in which the properties of the various materials and processes involved operate together to achieve the goals desired in the ultimate structure. Although the Hovel et al invention describes particular advantages with respect to a gallium arsenide substrate, the idea may be used with all substrates.

DISCLOSURE OF THE INVENTION

The present invention provides an improved method for producing self-aligned ohmic contacts in the fabrication of gallium arsenide semiconductors. More specifically, the present invention provides a deposition step utilizing a gate mask having been selectively removed to form sidewalls with slope profiles of a desired inclination. The gate material is delineated under the gate mask and selectively undercut to define a shape capable of controlling deposition and substantially reducing shadowing of materials deposited thereafter. Ohmic contact material is deposited selectively over the gate mask onto the substrate surface in self-alignment with the gate material. Subsequently, the gate mask may be removed and further fabrication steps taken to produce a complete semiconductor device.

A method of making self-aligned ohmic contacts with substantially reduced shadowing is disclosed which includes forming a channel region into a supporting substrate of the type having a surface to furnish a channel region containing a carrier concentration of a desired conductivity type thereunder, depositing a layer of gate material atop the supporting substrate, the gate material overlying and electrically communicating with the channel region, and covering the gate region with a layer of gate mask material and selectively removing gate mask material to form a gate mask having sidewalls with slope profiles of a desired inclination. The gate material is then delineated under the gate mask and selectively undercut to define a shape capable of substantially reducing shadowing of the materials deposited afterwards, including selectively deposited ohmic contact material. This method produces ohmic contacts in self-alignment with the previously deposited gate material.

In accordance with the invention, the gate material may be selected from the group consisting of molybdenum silicide, tungsten silicide, tantalum nitride and tungsten nitride. The gate material is deposited to a layer of about 0.1 to 1.0 microns in a conformal thickness. The gate mask material may be selected from the group consisting of nickel, aluminum, gold, titanium, chromium, silicon dioxide, silicon nitride, refractory metals, dielectrics, polymers and photoresist.

The gate mask is preferably shaped with sidewalls having slope profiles of angles greater than or equal to the angle at which the ohmic contact material is deposited onto the substrate surface. These slope profiles may be in the range of from about 5 degrees to about 85 degrees, depending on the angle of evaporation. Further embodiments include complex slope having at least one inclination, and preferably two. A further embodiment includes gate mask material covering the gate material with a thickness selected to minimize shadowing. This thickness may be from about 0.1 to about 2.0 microns in thickness in a rectangular shape. The gate mask material defines a gate length of from about 1.0 to about 2.0 microns in length.

The ohmic contact material is preferably selected from the group consisting of gold-germanium, gold, platinum, titanium nitride and nickel. The ohmic contact material achieves peak performance after ohmic alloying at a temperature in the range from about 300° to about 500° C. Thereafter, other materials are deposited, thereby producing a semiconductor device. The deposition of the various materials described above may preferably be accomplished by plasma-enhanced chemical vapor deposition, chemical vapor deposition, sputtering or any other conventional deposition means. Also in accordance with the present invention, the device is preferably constructed on a substrate wherein the channel region has N-type carriers ion implanted into the surface of the substrate.

The advantage of the present invention is the controlled deposition of the ohmic contact material for self-alignment with the gate material. The distance between the ohmic contact material and the gate on one side and the ohmic contact material and the gate on the other side may be regulated. Conventional production methods can result in intolerable differences in these distances, thereby producing poor quality or unacceptable semiconductor devices. Other advantages and features of the present invention will be appreciated from the following description.

BEST MODE FOR CARRYING OUT THE INVENTION

Figure 1:
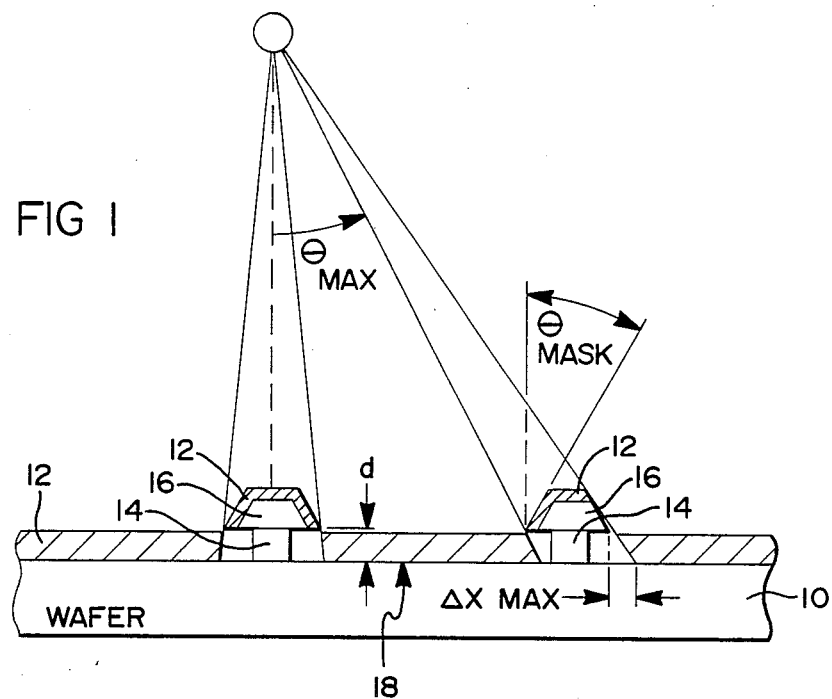
FIG. 1 illustrates in schematic form the geometric relation of the constituent portions of a semiconductor which is useful to the explanation of the present invention.

Referring now to FIG. 1, the relative position and geometric relation of the components of a semiconductor are shown. A semiconductor device is formed on a wafer substrate 10 of semiconductor material made of a composition such as semi-insulating gallium arsenide, silicon, indium phosphide, Group III-V ternary or quaternary compounds, or a film of any of these on top of another substrate, such as glass, single crystal silicon, gallium arsenide, mylar or stainless steel. The wafer substrate 10 has deposited thereon ohmic contact material 12, gate material 14 and a gate mask 16. The ohmic contact material 12 is evaporated onto the substrate 10 at a progressively greater angle as the distance from a point on the surface perpendicular to the source increases.

As illustrated, the gate mask 16 is located a distance shown as "d" in FIG. 1 from the wafer substrate surface 18. This distance "d" is determined by the height of the gate material 14. Ideally, the ohmic contact material 12 is deposited symmetrically on either side of the gate material 14. As can be seen in FIG. 1, the outerlying masked gates receive the ohmic contact material 12 at an angle. The maximum permissible angle, or $\theta_{max}$, is determined by the allowable tolerances for variation in the distances from the ohmic contact material 12 and the gate material 14 on either side. Because the gate mask 16 of the present invention is formed with sidewalls having a sloped profile, $\theta_{max}$ can be larger than conventional deposition methods permit. One of ordinary skill in the art will understand that with conventional techniques ohmic material deposition on the outerlying edge of the substrate would be located further from the gate material 14 than is possible with the gate mask configuration of the present invention.

Referring again to FIG. 1, the slope profile of the gate mask 16 has an angle, $\theta_{mask}$ which must be greater than or equal to $\theta_{max}$. Ohmic contact material 12 is most advantageously deposited so that $\Delta X_{max}$ is kept within a dimensional tolerance to assure production quality semiconductor devices. The maximum tolerable shadow encroachment may be calculated with the following formula:

If $\theta_{mask} \geq \theta_{max}$ then $\Delta X_{max} = d \tan \theta_{max}$ For example, in a typical device, if $\theta_{max} \leq 5°$ and $d = 0.3 \,\mu m$
then $\Delta X_{max} = (0.3 \,\mu m) \tan 5°$
$= (0.3 \,\mu m) (0.087)$
$= 0.026 \,\mu m$ Consequently, if 0.026 micrometers is within the production deposition offset tolerance scale, then any $\theta_{mask}$ greater than or equal to 5 degrees will produce a device within tolerance.

Figure 2:
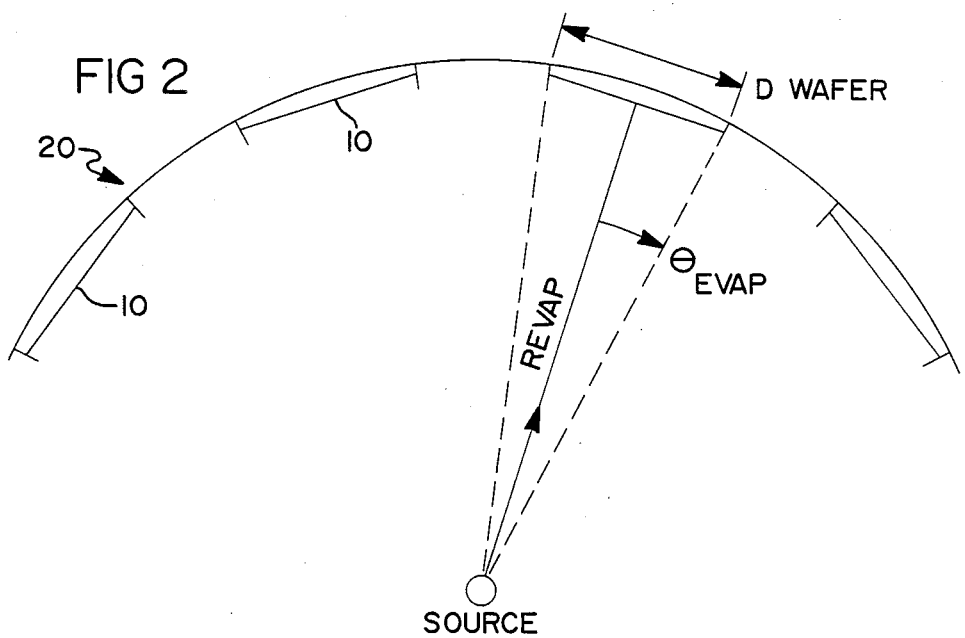
FIG. 2 illustrates the half dome configuration of a typical evaporation system.

Referring now to FIG. 2, the half dome configuration of a typical evaporation system is generally described by the numeral 20. Wafer substrates 10 having a length dimension $D_{wafer}$ are arranged as efficiently as possible about the interior of the half dome. The half dome configuration enables a maximum number of wafer substrates to receive perpendicular deposition angles from the evaporation source. The radius of evaporation, $R_{evap}$, is typically from 20 to 30 inches between the evaporation source and the center of a wafer substrate 10 arranged on the inner circumference of the half dome. The angle of evaporation ($\theta_{evap}$), is defined by (1) the perpendicular evaporation path from the source to the substrate, (2) one-half the length of the wafer substrate, and (3) the hypotenuse. To determine the angle of evaporation, one may solve the following maximum shadow encroachment equation:

If $D_{wafer}$ = 4 inches
$R_{evap}$ = 30 inches $$\tan^{-1} \theta_{evap} = \frac{D_{wafer}/2}{R_{evap}}$$

$$\theta_{evap} = \frac{4 \text{ inches}/2}{30 \text{ inches}}$$

$$= \frac{4/2}{30} \text{ rads}$$

$$= 4°$$

If an 8" wafer is desired,
then $$\theta_{evap} = \frac{8/2}{30} \text{ rads}$$

$$= 8.5°$$

Using these values in the maximum shadow encroachment equation above, a determination can be made for the maximum size of the wafer substrate which complies with the production deposition offset tolerances.

Looking now to FIG. 3, the methodology of the present invention is shown through illustration of the progressive fabrication of a semiconductor device. FIG. 3a shows a supporting substrate 44 having a channel region 42 and ion implanted regions 48 formed therein below the surface 46. The desired conductivity type below the surface is preferably N+-type. A layer of gate material 50 is deposited atop the supporting substrate 44 and is overlying and in electrical communication with the channel region 42 and the ion implanted regions 48.

Figure 3A:
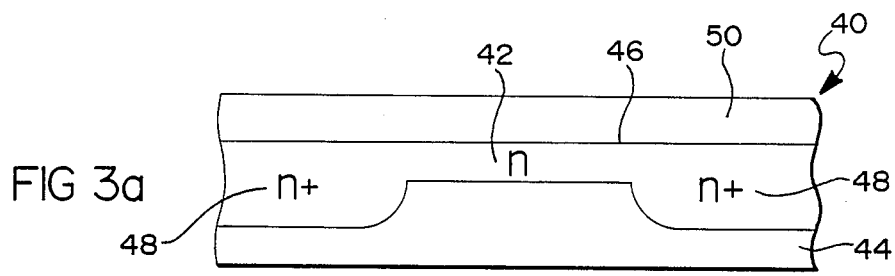
FIG. 3a-3e are schematic views of the progressive fabrication of a semiconductor device using the method of the present invention.
Figure 3B:
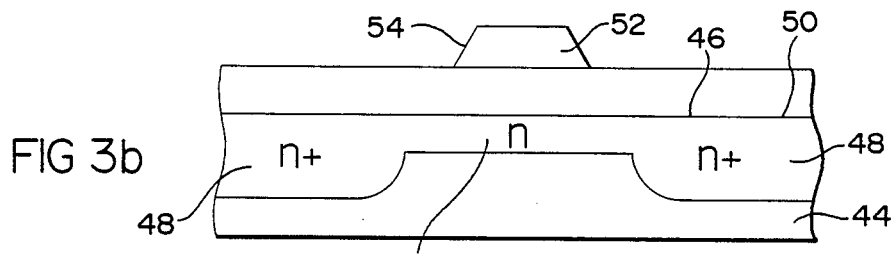
Figure 3C:
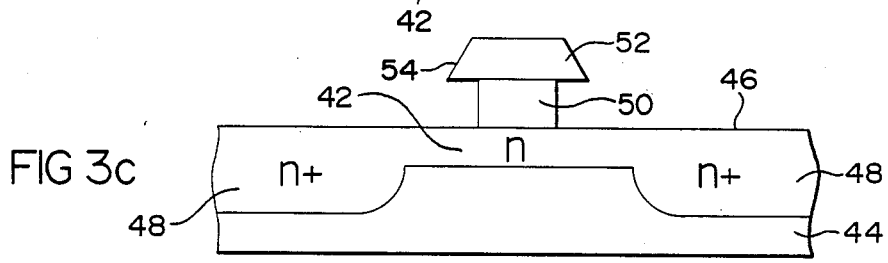

In FIG. 3b, gate material 50 is covered with a layer of gate mask material 52. The gate mask material 52 has been selectively removed to form a gate mask having sidewalls 54 with slope profiles of a desired inclination and such methods are described hereinafter. In FIG. 3c, gate material 50 is shown delineated under gate mask 52 by being selectively undercut to define a shape capable of substantially reducing shadowing of materials deposited thereafter.

Figure 3D:
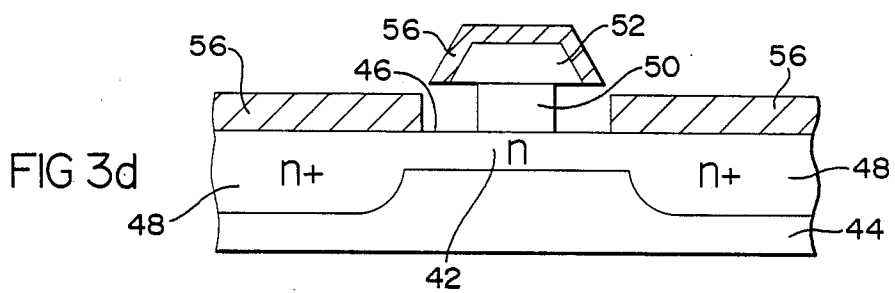
Figure 3E:
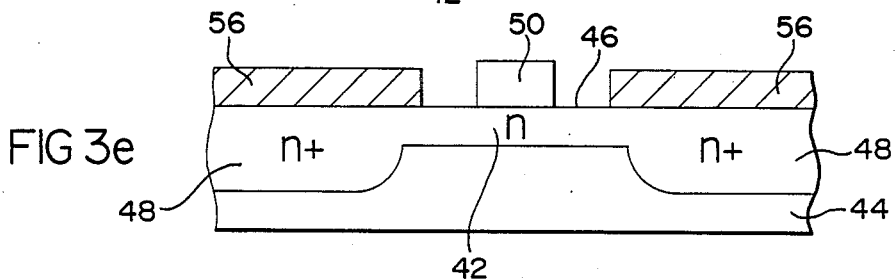

In FIG. 3d, ohmic contact material 56 has been selectively deposited onto the substrate surface 46 in self-alignment with the gate material 50. As can be seen, ohmic contact material 56 has been deposited symmetrically about gate material 50, illustrating a perpendicular deposition. Thereafter, gate mask material 52 is lifted off in FIG. 3e, removing the ohmic contact material 56 deposited thereon, leaving ohmic contact material 56 on the surface 46 of the substrate 44 and gate material 50 exposed, ready for further fabrication steps. Further steps, including depositions of metal contact materials, plasma oxides, reactive ion etching and sputter deposition and ion milling of second level metal depositions, may be performed to produce the desired semiconductor device.

Referring again to FIGS. 3a–3e, gate material 50 is conformally deposited onto the substrate surface 46 to a thickness of about 0.1 to 2.0 microns. The gate material may be selected from the group consisting of molybdenum silicide, tungsten silicide, tantalum nitride, titanium nitride silicide, titanium refractory metals and tungsten nitride. Gate mask material 52 may be selected from the group consisting of nickel, aluminum, gold, titanium, chromium, silicon dioxide, silicon nitride, refractory metals, dielectrics, polymers, and photoresists. Side walls 54 with slope profiles of a desired inclination have angles greater than or equal to the angle at which the ohmic contact material 56 is deposited onto the substrate surface 46. These sidewall angles are selectively formed, removed or deposited to form sidewalls having inclinations from about 5 degrees to about 85 degrees.

The slope of sidewall 54 is produced by different methods for different gate mask materials, including forming, removing or depositing. In the case of a photoresist gate mask, conventional lift-off techniques including chemical washing can easily and reproducibly determine the angle of the slope. Nickel and aluminum gate masks automatically give 10 to 15 degree angles from the liftoff process used to photolithographically select the shape of the mask. Certain characteristics of aluminum produce desired high sidewall angles, while using gold produces a very low angle for the sidewall.

Figure 4A:
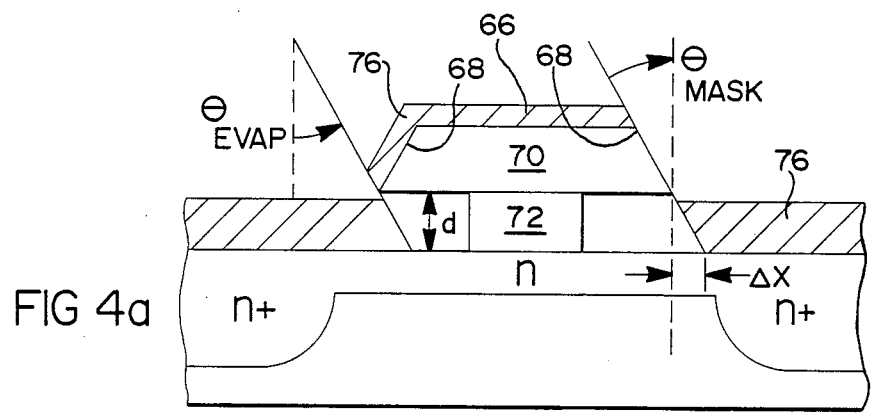
FIG. 4 illustrates cross sectional views of various embodiments of the semiconductor devices manufactured in accordance with the method of the present invention.

With reference to FIG. 4a, a detailed view of an angular ohmic contact material deposition is shown. Delineated gate material 72 has been deposited to a thickness "d" and has gate mask material 70 deposited thereon. The ohmic contact material 76 is deposited onto the wafer and is also deposited onto the surface 66 of gate mask material 70. Sidewalls 68 have a slope profile of an angle greater than or equal to the angle of evaporation, $\theta_{evap}$. Due to the angularity of the deposition, ohmic contact material 76 is non-symmetrical about the gate material 72. This non-symmetry results in a variation in the distances between ohmic contact material 76 and gate material 72, illustrated as $\Delta X$. As described above, production deposition offset tolerances are defined by $\Delta X$. This difference in distance effects the performance of the device.

Figure 4B:
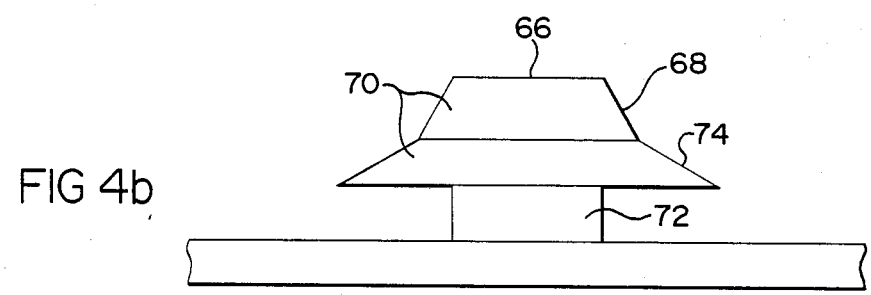

FIG. 4b illustrates gate mask material 70 having a top surface 66, a first sidewall 68 formed at a first angle and a second sidewall 74 formed at a second angle. Gate material 72 is located underneath and is selectively undercut to minimize shadowing. First and second sidewalls 68 and 74 may be achieved by controlled chemical etching or multiple material depositions. In the instance of a multiple material deposition, the first portion of gate mask material 70 having an inclination 74 may be of a first material, such as aluminum, having a first slope which is characteristic of the material. A second material to be deposited may be chosen which is characterized by a greater slope 68 when deposited. Varying slopes occur automatically upon deposition when different materials are used. A preferred embodiment includes a first deposition of aluminum, followed by a second deposition of gold.

Figure 4C:
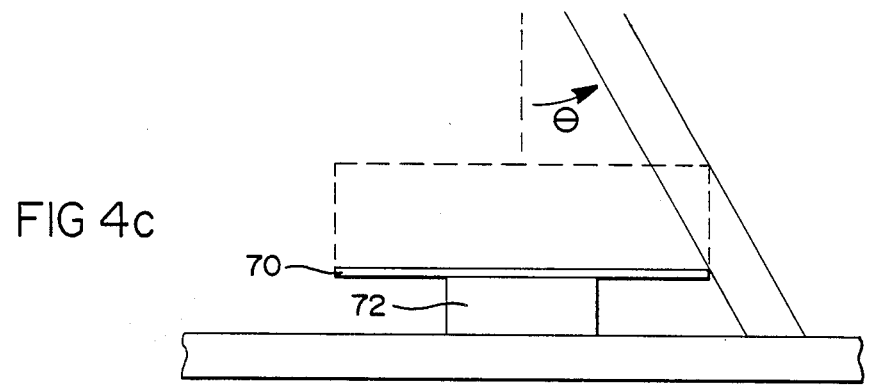

FIG. 4c illustrates gate mask material 70 having a thickness selected to minimize shadowing by depositing to a thickness of about 2000 angstroms. Gate mask material 70 is sufficiently thin to substantially reduce the shadowing effect of a conventional gate mask. The mask thickness of the above-described gate masks having sidewalls may be from about 2000 angstroms to about 2.0 microns, having a length defining a gate length of greater than about 0.1 microns in length.

The ohmic contact material described above in all the FIGURES includes at least one layer of a material selected from the group consisting of gold-germanium, gold, platinum, titanium nitride, nickel and aluminum. The ohmic contact material must be selected to allow alloying at temperatures in the range from about 300° to about 500° C. and withstand previous and further annealing steps.

It is to be understood that the foregoing description is illustrative in nature and shall not be construed in a limiting sense. Many modifications and variations of the present invention are possible in light of the above teachings. Therefore, it is to be understood that within the scope of the appended claims the invention may be practiced otherwise than is specifically described.

What is claimed is:

1. A method of making a semiconductor device having self aligned ohmic contacts comprising:
    forming a channel region in a supporting substrate, adjacent to one surface thereof, said channel region containing a carrier concentration of a desired conductivity type;
    depositing a layer of gate material on said one surface of said substrate, said layer of gate material overlaying and in electrical contact with said channel region;
    forming a gate mask on the surface of said gate material, said gate mask having sidewalls disposed at an angle relative to said one surface of said supporting substrate, said angle being at least as great as the maximum angle of evaporative deposition of ohmic contact material onto said gate mask from a remote source;
    delineating said gate material under said gate mask to form a gate;
    selectively depositing said ohmic contact material onto said one surface of said supporting substrate from said remote source to form said ohmic contacts, said gate mask shielding an area on the surface of said substrate adjacent to said gate to prohibit said deposited ohmic contacts from making electrical contact with said gate.

2. A method as in claim 1 wherein forming a channel region includes ion implanting N-type carriers into the substrate.

3. A method as in claim 1, wherein said depositing a layer of gate material includes conformally depositing the gate material onto the substrate surface.

4. A method as in claim 1, wherein said layer of gate material is deposited to a thickness of from about 0.1 to 2.0 microns.

5. A method as in claim 1, wherein said layer of gate material is selected from the group of materials consisting of molybdenum silicide, tungsten silicide, tantalum nitride, titanium nitride silicide, titanium refractory metals and tungsten nitride.

6. A method as in claim 1, wherein the angle of said sidewall is in the range from 5 degrees to about 85 degrees.

7. A method as in claim 1, wherein said gate mask has sidewalls with complex slope profiles having at least one inclination.

8. A method as in claim 1, wherein the shape of said gate mask is photolithographically determined.

9. A method as in claim 1, wherein the thickness of said gate mask is selected to minimize shadowing.

10. A method as in claim 1, wherein said gate mask has a thickness ranging from about 0.1 to about 2.0 microns.

11. A method as in claim 1, wherein said ohmic contact material is selected from the group consisting of gold-germanium, gold, platinum, titanium nitride and nickel.

12. A method as in claim 1, further comprising the step of alloying said ohmic contact material at a temperature in the range from about 300° C. to about 500° C.

13. A semiconductor device of the type having a substrate supporting a channel region containing a carrier concentration of a desired conductivity type, a gate electrically coupled to the channel region, and first and second ohmic contacts positioned on opposite sides of the gate, manufactured in accordance with the process of:
    forming the gate on the channel region;
    forming the gate mask atop the gate and characterized by sidewalls having an angularity relative to the surface of the substrate which is greater than the angle of evaporative deposition of ohmic contact material from a point source to the extreme gate position on the substrate;
    depositing ohmic contact material on the substrate from a point source; and
    removing the gate mask to yield a device having first and second ohmic contacts having correct positional relationship o the mediate gate independent of the position of the gate on the substrate.

14. A method of forming self-aligned ohmic contacts on a semiconductor device of the type having a gate which is electrically coupled to a substrate comprising the steps of:
    forming a gate mask of material selected from the group consisting of nickel, aluminum gold, titanium chromium, silicon dioxide, silicon nitride, refractory metals and dielectrics over the gate, said gate mask having sidewalls which are disposed at an angle relative to the surface of the substrate, said angle being at least as great as the angle of evaporative deposition of an ohmic contact material from a remote point source to the position of said gate mask on the substrate;
    depositing said ohmic contact material onto the substrate from said remote point source with said gate mask prohibiting the deposition of said contact material on an area on the surface of said substrate adjacent to said gate to electrically isolate said gate from the ohmic contact material being deposited; and
    removing said gate mask.

* * * * *